(12) United States Patent
Choi et al.

(10) Patent No.: US 11,956,996 B2
(45) Date of Patent: Apr. 9, 2024

(54) DISPLAY DEVICE WITH ENHANCED LIGHT TRANSMISSION CAPABILITIES

(71) Applicant: LG Display Co., Ltd., Seoul (KR)

(72) Inventors: Jung Hun Choi, Paju-si (KR); Sung Jin Park, Paju-si (KR); Mi Ran Rim, Paju-si (KR); Min Ha Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 16 days.

(21) Appl. No.: 17/350,996

(22) Filed: Jun. 17, 2021

(65) Prior Publication Data
US 2021/0408496 A1   Dec. 30, 2021

(30) Foreign Application Priority Data

Jun. 30, 2020 (KR) .......................... 10-2020-0080180

(51) Int. Cl.
*H10K 50/86* (2023.01)
*H04N 23/57* (2023.01)
*H10K 59/121* (2023.01)
*H10K 59/65* (2023.01)

(52) U.S. Cl.
CPC .......... *H10K 50/86* (2023.02); *H10K 59/121* (2023.02); *H10K 59/65* (2023.02); *H04N 23/57* (2023.01)

(58) Field of Classification Search
CPC ............ H01L 51/5281; H01L 27/3234; H01L 27/326; H10K 50/86; H10K 59/65
See application file for complete search history.

(56) References Cited

U.S. PATENT DOCUMENTS

| 2018/0136766 A1* | 5/2018 | Kim ...................... G06F 3/0443 |
| 2022/0181397 A1* | 6/2022 | Choi ................... H01L 27/3234 |

FOREIGN PATENT DOCUMENTS

| CN | 111244319 A | * | 6/2020 | ............. H01L 27/32 |
| KR | 10-2016-0141901 A | * | 12/2016 | |

OTHER PUBLICATIONS

Machine Translation of CN-111244319-A, published Jun. 5, 2020.*

* cited by examiner

*Primary Examiner* — Suberr L Chi
(74) *Attorney, Agent, or Firm* — POLSINELLI PC

(57) ABSTRACT

A display panel includes a substrate having a first area in which first pixels are disposed and a second area in which second pixels and a light-transmitting area disposed between the second pixels are disposed, and a polarizing plate disposed above the light-transmitting area and including a light-transmitting pattern having a light transmittance higher than that of the remaining area, wherein the substrate includes a high-transmission area having a higher light transmittance than the remaining portion in a position corresponding to the second area.

21 Claims, 18 Drawing Sheets

DISPLAY DEVICE WITH ENHANCED LIGHT TRANSMISSION CAPABILITIES

CROSS-REFERENCE TO RELATED APPLICATION

This application claims priority to and the benefit of Korean Patent Application No. 10-2020-0080180, filed on Jun. 30, 2020, which is hereby incorporated by reference in its entirety.

BACKGROUND

Field of the Disclosure

The present disclosure relates to a display panel and a display device including the same.

Description of the Background

An image display device, which displays various pieces of information on a screen, is a core technology of the information communication age and is being developed to be thinner, lighter, and more portable, and to have higher performance. In addition, various demands for a display device are being increased, and various types of display devices such as a liquid crystal display device, an organic light-emitting display device, a quantum dot display device, and the like are being utilized in accordance with the demands.

Further, in order to provide users with a larger variety of application functions, an input device, which uses a touch sensor or the like, and an optical device such as a camera/proximity sensor and the like are mounted in a display device. However, as the optical device is combined to the display device, there is a problem that the design of the display device becomes difficult. In particular, the camera and the proximity sensor have to be exposed to the outside for the entrance and exit of light, and thus there is a problem that a display area of a display panel is inevitably reduced.

Accordingly, in the related art, a display device has been designed in a design having a large bezel so that an optical device is installed and exposed, a design in which a display panel is cut out in a notch shape, or a design in which the optical device is exposed through a portion of the display panel in the form of a hole. However, the size of a screen is still restricted due to a camera, and thus it is difficult to implement a full-screen display.

SUMMARY

In order to implement a full-screen display, a method of preparing an image area in which low-resolution pixels are disposed in a screen of a display panel, and disposing a camera and/or various sensors at a position under the display panel, which faces the image area, has been proposed. However, since the pixels are disposed in the image area, there is a problem that light transmittance is lowered, and performance of the camera and/or the various sensors are degraded. Accordingly, the present disclosure is directed to proposing a structure of a display device capable of effectively transmitting light toward an optical device. The present disclosure is not limited to the above-described features, and other features that are not described herein will be apparently understood by those skilled in the art from the following description.

The substrate may include a first substrate, a second substrate, and an inorganic film formed between the first substrate and the second substrate, the first pixels and the second pixels may be disposed on the second substrate, and the high-transmission area may include at least one of a first high-transmission area provided in the first substrate and a second high-transmission area provided in the second substrate.

The first high-transmission area may be an area in which the first substrate is removed and filled with a transparent resin, and the second high-transmission area may be an area in which the second substrate is removed and filled with a transparent organic material or a transparent inorganic material. The transparent organic or inorganic material may be the same material as a layer included in the first pixel or the second pixel.

The second high-transmission area may be provided at a position corresponding to the light-transmitting area in the second area. Each of the first high-transmission area and the second high-transmission area may have a tapered cross-section, and in a cross-sectional view, a lateral side of the first high-transmission area may be collinear with a lateral side of the second high-transmission area.

The polarizing plate may include a first protective layer, a second protective layer, and a polarizer disposed between the first protective layer and the second protective layer, and the light-transmitting pattern may be formed in the polarizer. The light-transmitting pattern may include an opening formed in the polarizer. The first protective layer may include a protrusion inserted into the opening. The light-transmitting area may include a discolored area formed in the polarizer, and the discolored area may be an area in which an iodine compound of the polarizer is decomposed.

The display panel may further include an anti-reflection layer disposed in the second area and provided to reduce diffusion or reflection of incident light. The anti-reflection layer may be located on at least one of an upper portion of an interlayer insulating layer, a lower portion of the substrate, an upper portion of the polarizing plate, and a lower portion of the polarizing plate.

The first high-transmission area may have a forward-tapered cross-section and the second high-transmission area may have a reverse-tapered cross-section, or the first high-transmission area may have a reverse-tapered cross-section and the second high-transmission area may have a forward-tapered cross-section.

Specific items of other aspects are included in the detailed descriptions and drawings.

BRIEF DESCRIPTION OF THE DRAWINGS

The above and other features and advantages of the present disclosure will become more apparent to those of ordinary skill in the art by describing exemplary aspects thereof in detail with reference to the accompanying drawings, in which:

FIG. 4 is a view illustrating pixels of an imaged area and light-transmitting areas according to one aspect of the present disclosure;

DETAILED DESCRIPTION

Figure 1:
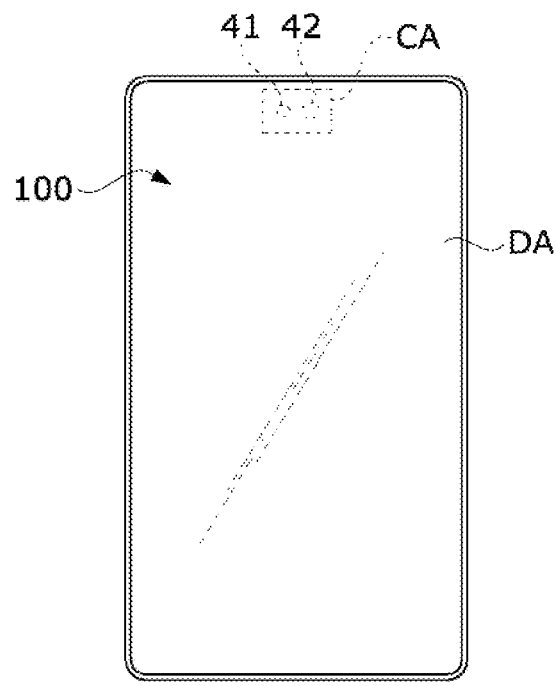
FIG. 1 is a conceptual diagram of a display device according to one aspect of the present disclosure.

Advantages and features of the present disclosure and a method of achieving the same should become clear with aspects described in detail below with reference to the accompanying drawings. However, the present disclosure is not limited to the aspects described below and may be embodied with a variety of different modifications. The aspects are merely provided to allow those skilled in the art to completely understand the scope of the present disclosure, and the present disclosure is defined only by the scope of the claims.

The figures, dimensions, ratios, angles, numbers, and the like disclosed in the drawings for describing the aspects of the present disclosure are merely illustrative and are not limited to matters shown in the present disclosure. Throughout the disclosure, like reference numerals refer to like elements. Further, in describing the present disclosure, detailed descriptions of well-known technologies will be omitted when it is determined that they may unnecessarily obscure the gist of the present disclosure. Terms such as "including," "having," and "composed of" used herein are intended to allow other elements to be added unless the terms are used with the term "only." Any references to the singular may include the plural unless expressly stated otherwise. Components are interpreted to include an ordinary error range even if not expressly stated.

For the description of a positional relationship, for example, when the positional relationship between two parts is described as "on," "above," "below," "next to," and the like, one or more parts may be interposed therebetween unless the term "immediately" or "directly" is used in the expression. When an element or layer is disposed "on" another element or layer, the element is disposed directly on another element or layer or disposed on another element or layer with still another element therebetween. It should be noted that when one component is described as being "connected," "coupled," or "joined" to another component, still another component may be "connected," "coupled," or "joined" between the two components, even though the component may be directly "connected," "coupled," or "joined" to the other component.

Although the terms "first," "second," and the like may be used herein to describe various components, the components are not limited by the terms. The terms are only used to distinguish one component from another. Therefore, a first component described below may be a second component within the technological scope of the present disclosure.

The size and thickness of each configuration illustrated in the drawings are shown for convenience of description, and the present disclosure is not necessarily limited to the size and thickness of the configuration illustrated.

Hereinafter, various aspects of the present disclosure will be described in detail with reference to the accompanying drawings.

Figure 2:
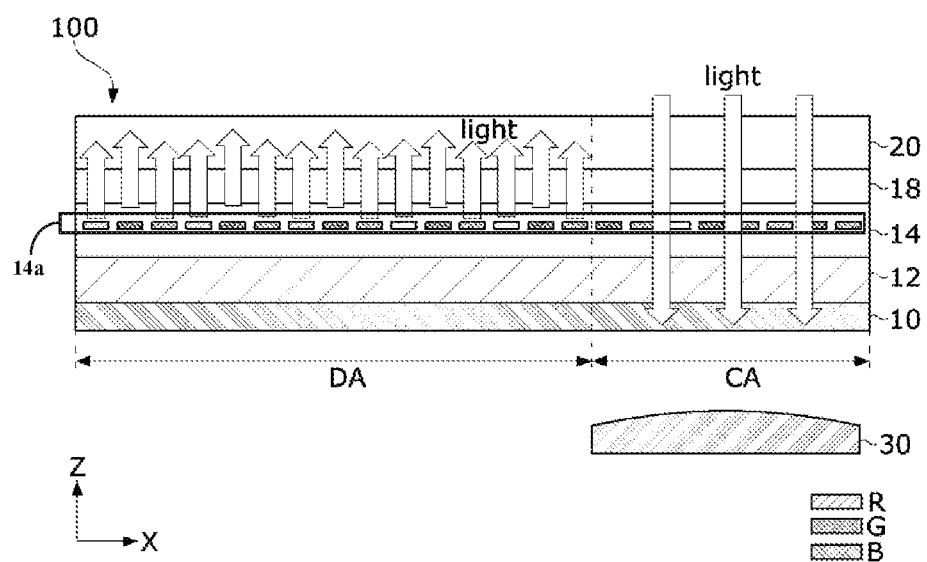
FIG. 2 is a schematic cross-sectional view illustrating a display panel according to the aspect of the present disclosure.
Figure 3:
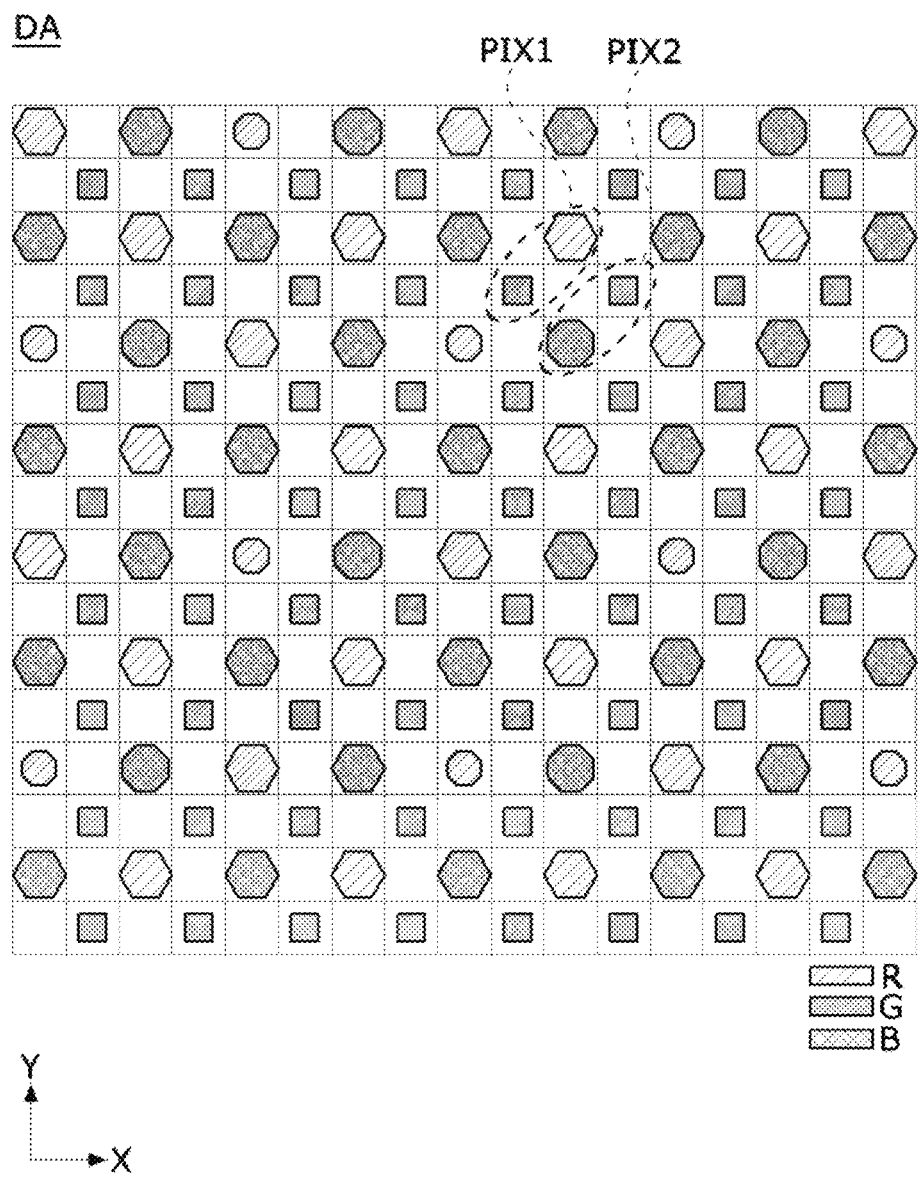
FIG. 3 is a view illustrating a pixel arrangement in a display area according to one aspect of the present disclosure.

FIG. 1 is a conceptual diagram of a display device according to one aspect of the present disclosure, FIG. 2 is a schematic cross-sectional view illustrating a display panel according to the aspect of the present disclosure, and FIG. 3 is a view illustrating a pixel arrangement in a display area according to one aspect of the present disclosure.

Referring to FIG. 1, a front surface of a display panel 100 may be configured as a display area. The display area may include a first area DA and a second area CA. The first area DA and the second area CA may all output an image but may be different in resolution. For example, a resolution of a plurality of second pixels disposed in the second area CA may be lower than a resolution of a plurality of first pixels disposed in the first area DA. A sufficient amount of light may be injected into sensors 41 and 42 disposed in the second area CA by as much as the resolution lowered in the plurality of second pixels disposed in the second area CA. However, the present disclosure is not limited thereto, and the resolution of the first area DA and the resolution of the second area CA may be the same as long as the second area CA may have a sufficient light transmittance or an appropriate noise compensation algorithm may be implemented.

The second area CA may be an area in which the sensors 41 and 42 are disposed. The second area CA is an area that overlaps various sensors, and thus may be smaller in area than that of the first area DA outputting most of the image. The sensors 41 and 42 may include at least one of an image sensor, a proximity sensor, an illumination sensor, a gesture sensor, a motion sensor, a fingerprint recognition sensor, and a biometric sensor. As an example, a first sensor 41 may be an illumination sensor and a second sensor 42 may be an image sensor configured to capture an image or a video, but the present disclosure is not necessarily limited thereto.

The second area CA may be disposed at a portion to which the light needs to be incident. For example, the second area CA may be disposed on an upper left or right side of the display area and may also be disposed entirely on an upper end of the display area. A width of the second area CA may be variously modified. However, the present disclosure is not necessarily limited thereto, and the second area CA may be disposed at a central portion of the display area or disposed on a lower end of the display area. In the following description, the first area DA may be described as being a display area and the second area CA may be described as being an image area.

Referring to FIGS. 2 and 3, the display area DA and the image area CA may include a pixel array in which pixels, to which pixel data is written, may be disposed. The number of pixels per unit area (pixels per inch (PPI)) of the image area CA may be lower than that of the display area DA in order to ensure the light transmittance of the image area CA.

The pixel array of the display area DA may include a pixel area (a first pixel area) in which a plurality of pixels having a high PPI are disposed. The pixel array of the image area CA may include a pixel area (a second pixel area) in which a plurality of pixel groups having a relatively low PPI are disposed by being spaced apart from each other by light-transmitting areas. In the image area CA, external light may be transmitted through the display panel 100 through the light-transmitting areas having a high light transmittance, and may be received by a sensor placed under the display panel 100.

Since both the display area DA and the image area CA include the pixels, an input image may be reproduced on the display area DA and the image area CA.

Each of the pixels of the display area DA and the image area CA may include sub-pixels having different colors to implement a color of an image. The sub-pixels may include a red sub-pixel (hereinafter referred to as an "R sub-pixel"), a green sub-pixel (hereinafter referred to as a "G sub-pixel"), and a blue sub-pixel (hereinafter referred to as a "B sub-pixel"). Although not shown in the drawings, each of the pixels may further include a white sub-pixel (hereinafter, referred to as a "W sub-pixel"). Each of the sub-pixels may include a pixel circuit and a light-emitting element (organic light-emitting diode: OLED).

The image area CA may include the pixels and a camera module disposed under a screen of the display panel 100. The pixels of the image area CA may display an input image by writing pixel data of the input image in a display mode.

The camera module may capture an external image in an image capturing mode to output a picture or video image data. A lens of the camera module may face the image area CA. The external light is incident on a lens 30 of the camera module through the image area CA, and the lens 30 may condense light to an image sensor that is omitted from the drawing. The camera module may capture the external image in the image capturing mode to output a picture or video image data.

In order to ensure the light transmittance, due to the pixels removed from the image area CA, an image quality compensation algorithm for compensating for luminance and color coordinates of the pixels in the image area CA may be applied.

In the aspects of the present disclosure, low-resolution pixels may be disposed in the image area CA. Thus, the display area of the screen is not restricted due to the camera module, so that a full-screen display may be implemented.

Referring to FIG. 3, the display area DA may include pixels PIX1 and PIX2 arranged in a matrix form. Each of the pixels PIX1 and PIX2 may be implemented as a real-type pixel in which R, G, and B sub-pixels of three primary colors form one pixel. Each of the pixels PIX1 and PIX2 may further include a W sub-pixel omitted from the drawing. In addition, two sub-pixels may form one pixel using a sub-pixel rendering algorithm. For example, a first pixel PIX1 may include R and G sub-pixels, and a second pixel PIX2 may include B and G sub-pixels. Insufficient color representation in each of the pixels PIX1 and PIX2 may be compensated with an average value of pieces of corresponding color data between adjacent pixels.

Figure 4:
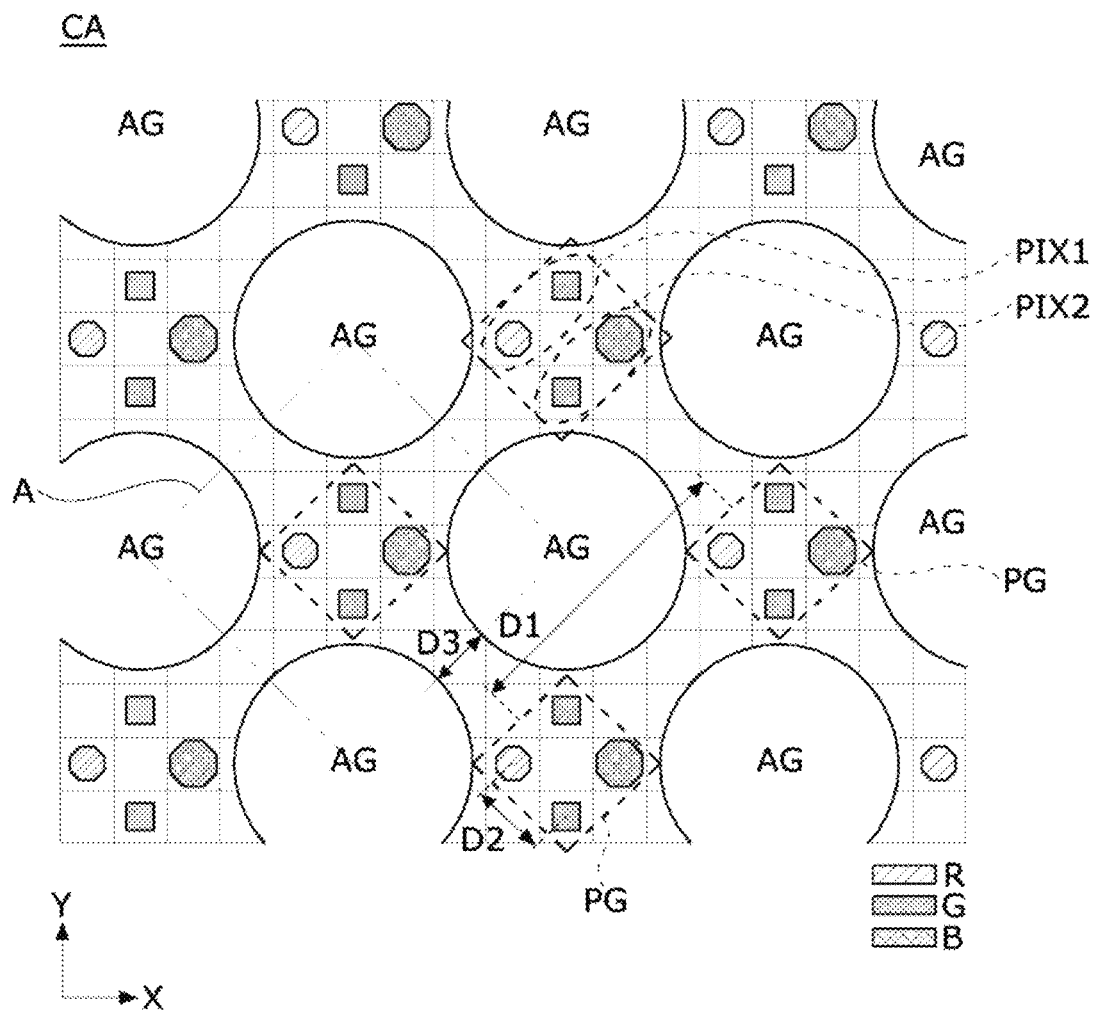
FIG. 4 is a view illustrating pixels of an image area and light-transmitting areas according to one aspect of the present disclosure.
Figure 5:
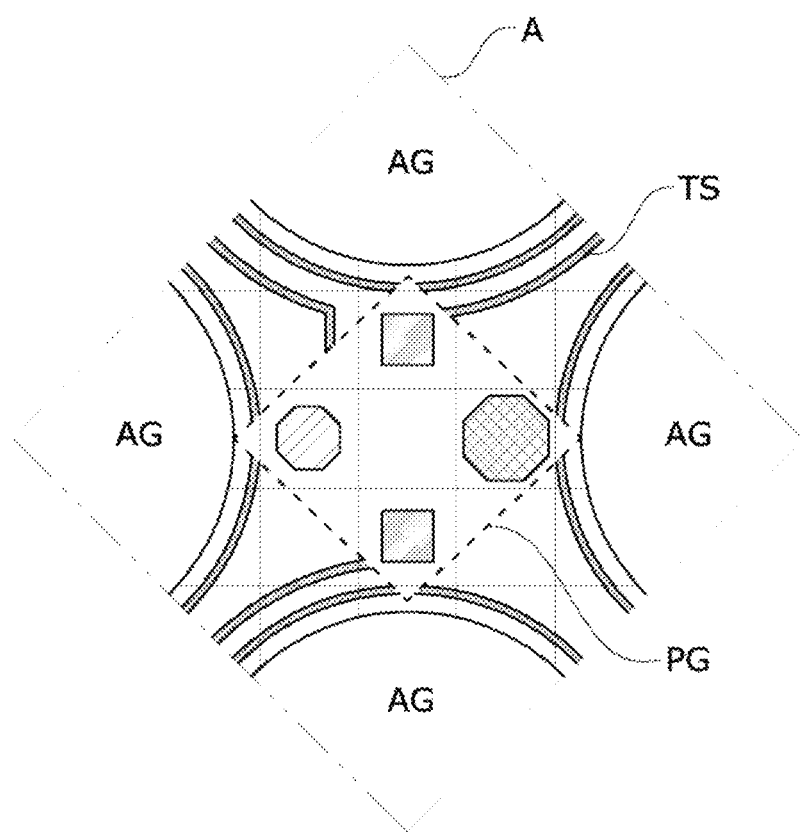
FIG. 5 is an enlarged view of portion A of FIG. 4.

FIG. 4 is a view illustrating the pixels of the image area and the light-transmitting areas according to one aspect of the present disclosure, and FIG. 5 is an enlarged view of portion A of FIG. 4.

Referring to FIGS. 4 and 5, a plurality of light-transmitting areas AG may be disposed between the plurality of second pixels. Specifically, the image area CA may include pixel groups PG spaced apart from each other by a predetermined distance D1, and the light-transmitting areas AG each disposed between adjacent pixel groups PG. The external light may be received through the light-transmitting areas AG to the lens of the camera module. The pixel groups PG may be disposed to be spaced apart from each other in the pixel area.

The light-transmitting area AG may include transparent media having a high light transmittance without having metal so that light may be incident at a minimum light loss. The light-transmitting area AG may be made of transparent insulating materials without including metal lines or pixels. As the light-transmitting area AG becomes larger, the light transmittance of the image area CA may become higher.

Each of the pixel groups PG may include one or two pixels. Each of the pixels of the pixel group may include two to four sub-pixels. For example, the first pixel in the pixel group may include R, G, and B sub-pixels, or include two sub-pixels, and may further include a W sub-pixel.

A distance D3 between the light-transmitting areas AG may be less than a pitch D1 between the pixel groups PG. An interval D2 between the sub-pixels may be less than the pitch D1 between the pixel groups PG.

The shape of the light-transmitting area AG is illustrated as being a circular shape, but the present disclosure is not limited thereto. For example, the light-transmitting area AG may be designed in various shapes such as a circular shape, an elliptical shape, a polygonal shape, or the like.

All of the metal electrode material may be removed from the light-transmitting area AG. Accordingly, lines TS of the pixels may be disposed outside the light-transmitting area AG. Thus, light may be effectively incident through the light-transmitting area. However, the present disclosure is not necessarily limited thereto, and the metal electrode material may remain in a portion of the light-transmitting area AG.

Figure 6:
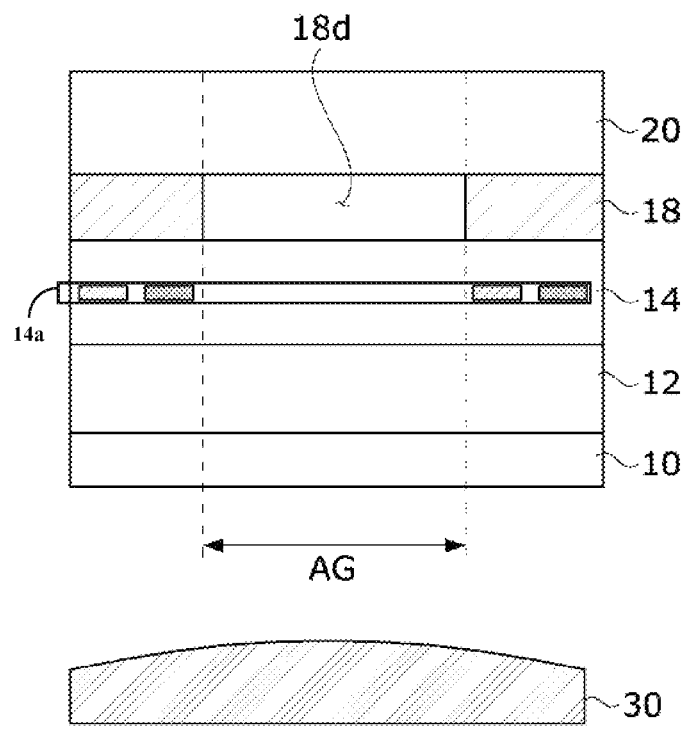
FIG. 6 is a schematic view illustrating a structure of the display panel of the image area.
Figure 7:
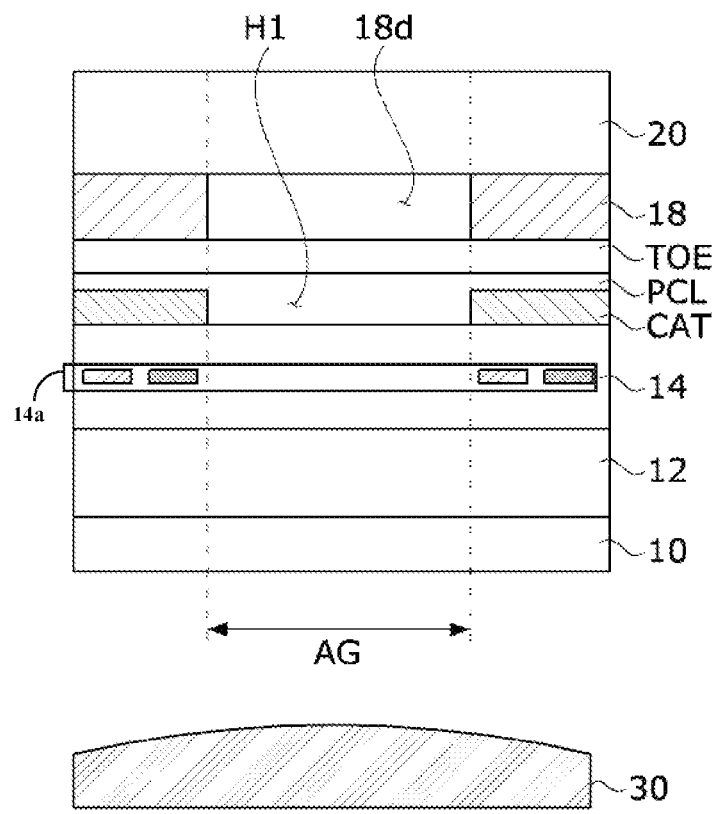
FIG. 7 is a modified example of FIG. 6.

FIG. 6 is a schematic view illustrating a structure of the display panel of the image area, and FIG. 7 is a modified example of FIG. 6.

Referring to FIG. 6, the display panel may include a circuit layer 12 disposed on a substrate 10, and a light-emitting element layer 14 disposed on the circuit layer 12. A polarizing plate 18 may be disposed on the light-emitting element layer 14, and a cover glass 20 may be disposed on the polarizing plate 18.

The display panel 100 has a width in an X-axis direction, a length in a Y-axis direction, and a thickness in a Z-axis direction. The display panel 100 may include the circuit layer 12 disposed on the substrate 10, and the light-emitting element layer 14 disposed on the circuit layer 12. The polarizing plate 18 may be disposed on the light-emitting element layer 14, and the cover glass 20 may be disposed on the polarizing plate 18.

The circuit layer 12 may include a pixel circuit connected to lines such as data lines, gate lines, power lines, and the like, a gate driving unit connected to the gate lines, and the like. The circuit layer 12 may include a circuit element such as a transistor implemented as a thin-film transistor (TFT), a capacitor, and the like. The lines and the circuit elements of the circuit layer 12 may be implemented with a plurality of insulating layers, two or more metal layers separated from each other with the insulating layers therebetween, and an active layer including a semiconductor material.

The light-emitting element layer 14 may include a light-emitting element driven by the pixel circuit. The light-emitting element may be implemented as an OLED. The OLED may include an organic compound layer formed between an anode and a cathode. The organic compound layer may include a hole injection layer HIL, a hole transport layer HTL, an emission layer EML, an electron transport layer ETL, and an electron injection layer EIL, but the present disclosure is not limited thereto. When a voltage is applied to the anode and the cathode of the OLED, holes passing through the hole transport layer HTL and electrons passing through the electron transport layer ETL move to the emission layer EML to create excitons and thus, visible is emitted from the emission layer EML. The light-emitting element layer 14 may further include a color filter array 14a disposed on the pixels that selectively may transmit red, green, and blue wavelengths.

The light-emitting element layer 14 may be covered by a protective film, and the protective film may be covered by an encapsulation layer. The protective film and the encapsulation layer may have a structure in which organic films and inorganic films are alternately stacked. The inorganic films may block the penetration of moisture or oxygen. The organic films may planarize a surface of the inorganic film. When the organic films and the inorganic films are stacked in multiple layers, the penetration of moisture/oxygen affecting the light-emitting element layer 14 may be effectively blocked since a movement path of the moisture or oxygen is increased in length as compared with a single layer.

The polarizing plate 18 may be adhered to the encapsulation layer. The polarizing plate 18 may improve outdoor visibility of the display device. The polarizing plate 18 may reduce light reflection from a surface of the display panel 100 and block the light reflected from metal of the circuit layer 12, thereby improving the brightness of the pixels. The polarizing plate 18 may be implemented as a polarizing plate 18 to which a linear polarizing plate and a phase retardation film are bonded, or a circular polarizing plate 18.

In the polarizing plate 18, a light-transmitting pattern 18d may be formed in an area corresponding to the light-transmitting area AG. Based on green light having a wavelength of 555 nm, a light transmittance of the substrate made of PI is about 70% to 80%, and a light transmittance of the cathode is 80% to 90%. On the other hand, a light transmittance of the polarizing plate 18 is relatively very low to about 40%. Thus, in order to effectively increase the light transmittance in the light-transmitting area, it is necessary to increase the light transmittance of the polarizing plate 18.

The polarizing plate 18 according to the aspect has the light-transmitting pattern 18d formed above the light-transmitting area AG to improve the light transmittance. The light transmittance of the area in which the light-transmitting pattern 18d is formed may be higher than that of the remaining area in the polarizing plate. In addition, the light transmittance of the area in which the light-transmitting pattern is formed may be highest in the polarizing plate. Thus, the amount of light introduced into the camera module in the light-transmitting area increases, thereby improving camera performance.

The light-transmitting pattern 18d of the polarizing plate 18 may be formed by removing a portion of the polarizing plate 18, and may also be formed by decomposing a compound constituting the polarizing plate 18. That is, the light-transmitting pattern 18d may have various structures capable of increasing the light transmittance of the conventional polarizing plate 18.

Referring to FIG. 7, in the light-transmitting area AG, the polarizing plate 18 may have a first light-transmitting pattern 18d, and a cathode CAT may have a second light-transmitting pattern. The second light-transmitting pattern may be an opening H1 formed in the light-transmitting area. Since the light transmittance of the cathode is 80% to 90%, the light transmittance of the light-transmitting area AG may be further increased due to the opening H1.

A method of forming the opening H1 in the cathode CAT is not particularly limited. As an example, after the cathode is formed, the opening H1 may be formed in the cathode using an etching process, or the cathode may be removed using an infra-red (IR) laser at a lower portion of the substrate 10.

A planarization layer PCL may be formed on the cathode CAT, and a touch sensor TOE may be disposed on the planarization layer PCL. Here, in the light-transmitting area AG, a sensing electrode and lines of the touch sensor may be made of a transparent material such as indium tin oxide (ITO) or a metal mesh, thereby increasing the light transmittance.

Figure 8A:
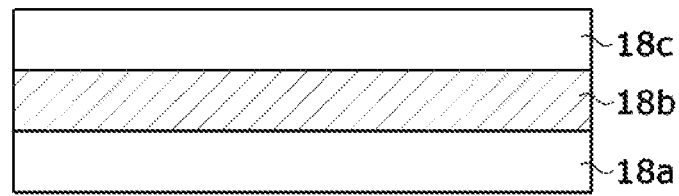
FIGS. 8A and 8B are views illustrating various structures of a polarizing plate.
Figure 8B:
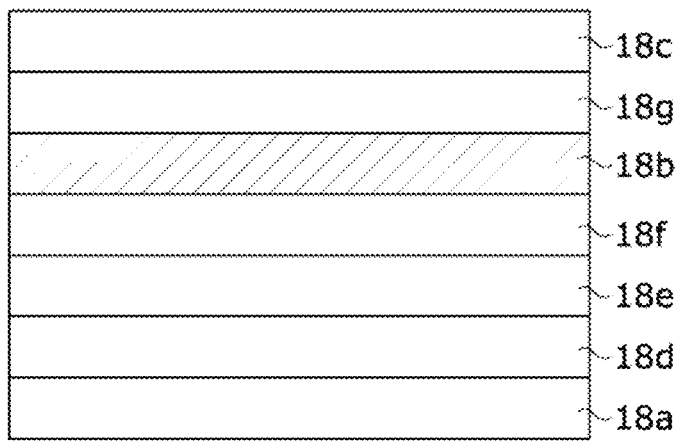
Figure 9:
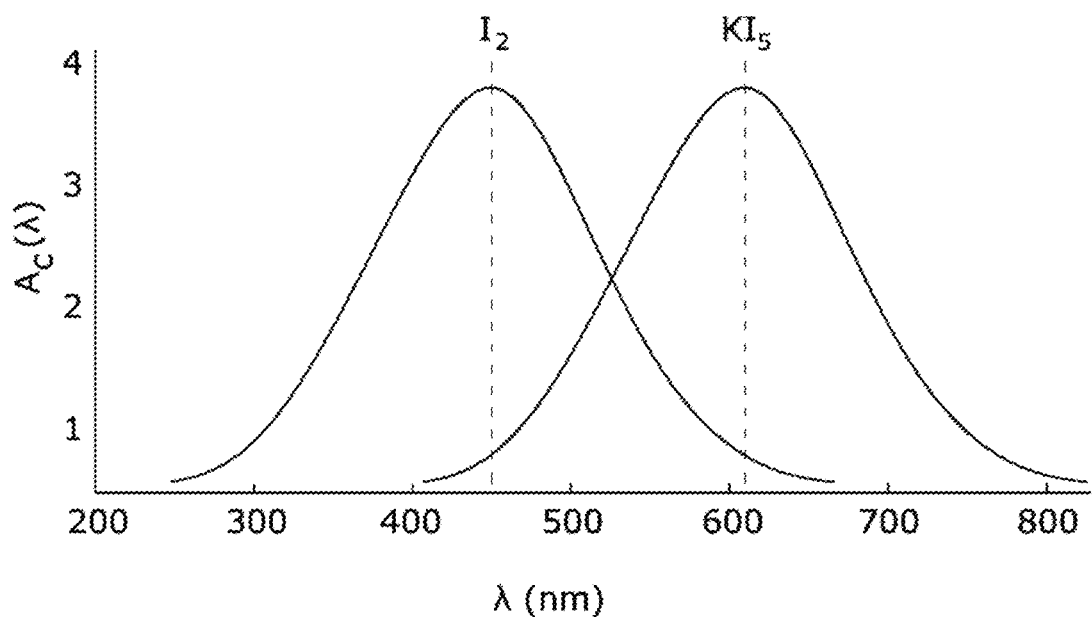
FIG. 9 is a graph illustrating an absorption spectrum of the polarizing plate.

FIGS. 8A and 8B are views illustrating various structures of the polarizing plate, and FIG. 9 is a graph illustrating an absorption spectrum of the polarizing plate.

The polarizing plate 18 may include a first protective layer 18a, a second protective layer 18c, and a polarizer 18b disposed between the first protective layer 18a and the second protective layer 18c.

The polarizer 18b may include a dichroic material. The dichroic material may include at least one of iodine and organic dyes. The organic dye may include azo-based pigments, stilbene-based pigments, pyrazolone-based pigments, triphenylmethane-based pigments, quinoline-based pigments, oxazine-based pigments, thiazine-based pigments, anthraquinone-based pigments, or the like, but the present disclosure is not necessarily limited thereto.

The polarizer 18b has a transmission axis in a direction perpendicular to a stretching direction. Iodine molecules and dye molecules exhibit a dichroic property, and thus the polarizer 18b may have a function of absorbing light vibrating in the stretching direction and transmitting light vibrating in the direction perpendicular to the stretching direction.

The polarizer 18b may have a weak mechanical strength with respect to a transmission axis direction. In addition, due to heat or moisture, the polarizer 18b may contract or have a polarization function be weakened. The first and second protective layers 18a and 18c are configured to protect the polarizer 18b while not changing the properties of light transmitted through the polarizer 18b, and may be formed using, for example, triacetyl cellulose (TAC). The TAC has a high light transmittance and relatively low birefringent, and is easily hydrophilized by surface modification, and thus is easily stacked on the polarizer 18b.

Referring to FIG. 8B, the polarizing plate 18 may further include various functional layers 18d, 18e, 18f, and 18g disposed on upper and lower portions of the polarizer 18b. As an example, the functional layers 18d, 18e, 18f, and 18g may include a pressure-sensitive adhesive (PSA), a quarter-wave plate (QWP), and a hard coating (HC). However, most of the layers constituting the polarizing plate 18 have a relatively high light transmittance compared to the polarizer 18b. Thus, in order to increase the light transmittance of the light-transmitting area AG, it is most important to control the light transmittance of the polarizer 18b.

Referring to FIG. 9, the polarizer 18b of the polarizing plate 18 is formed of an iodine compound, and a first iodine compound ($I_2$) has a maximum absorption peak at about 450 nm, and a second iodine compound ($KI_5$) has a maximum absorption peak at about 610 nm. In the absorption spectrum of the polarizer 18b, the first iodine compound ($I_2$) and the second iodine compound ($KI_5$) have a relatively high absorption peak, therefore the absorption peaks thereof need to be lowered.

Figure 10:
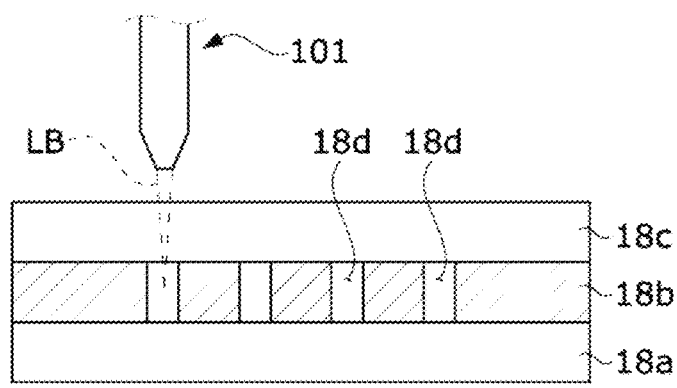
FIG. 10 is a view illustrating a process of forming a first light-transmitting pattern on a polarizing plate according to one aspect.
Figure 11:
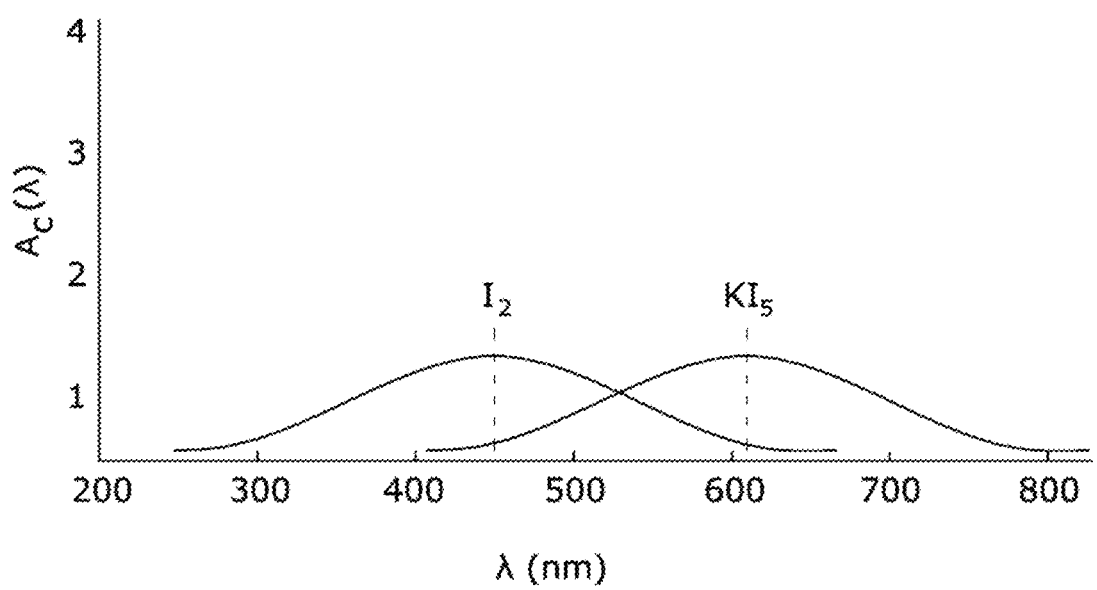
FIG. 11 is a graph illustrating an absorption spectrum of the polarizing plate in which a first light-transmitting pattern is formed.
Figure 12:
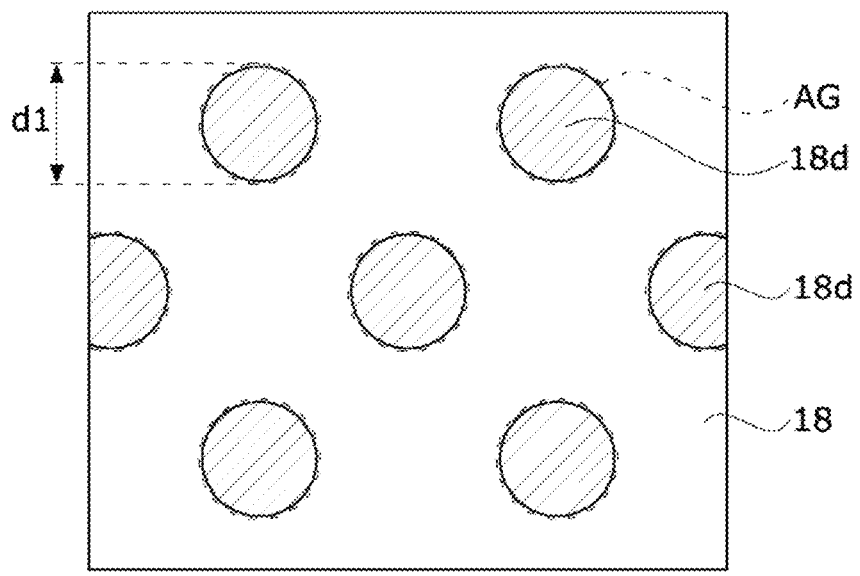
FIG. 12 is a plan view of the light-transmitting pattern.
Figure 13:
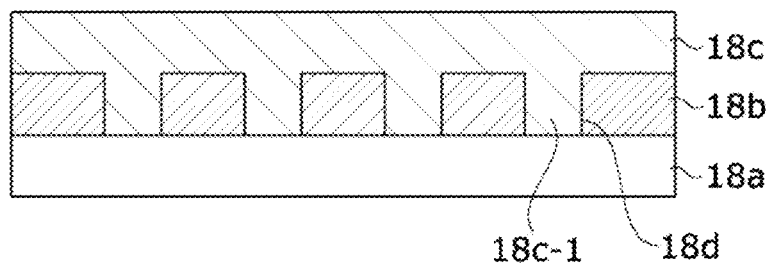
FIG. 13 is a view illustrating a polarizing plate according to another aspect.

FIG. 10 is a view illustrating a process of forming a first light-transmitting pattern on a polarizing plate according to one aspect, FIG. 11 is a graph illustrating an absorption spectrum of the polarizing plate in which the first light-transmitting pattern is formed, FIG. 12 is a plan view of the first light-transmitting pattern, and FIG. 13 is a view illustrating a structure in which a first light-transmitting pattern is formed on a polarizing plate according to another aspect.

As shown in FIG. 10, when an iodine compound is irradiated with a laser in a wavelength range having a high absorption rate, the iodine compound may be decomposed and the first light-transmitting pattern 18d may be formed. That is, the bonding between iodine molecules is broken, and separated iodine molecules are sublimated, and thus the first light-transmitting pattern 18d may be formed by decolorization.

As an example, when a first laser LB having a wavelength of 532 nm is irradiated, the first iodine compound ($I_2$) and the second iodine compound ($KI_5$) may be decomposed by absorbing the first laser. A laser irradiation device 101 may emit the first laser while moving through a plurality of light-transmitting areas to form the first light-transmitting pattern 18d on each of the light-transmitting areas.

With such a configuration, a single wavelength laser may be irradiated to simultaneously decompose the first iodine compound ($I_2$) and the second iodine compound ($KI_5$), thereby increasing an operation speed. Since a very large number of light-transmitting areas exist in the image area, it is necessary to form a very large number of first light-transmitting patterns.

Referring to FIG. 11, it can be seen that a light absorption peak of the first iodine compound and a light absorption peak of the second iodine compound become very low in a light absorption coefficient Ac.

However, the present disclosure is not necessarily limited thereto, and when a second laser having a wavelength of 450 nm is irradiated, the first iodine compound ($I_2$) may be decomposed by absorbing most of the laser. Also, when a third laser having a wavelength of 610 nm is irradiated, the second iodine compound ($KI_5$) may be decomposed by absorbing most of the laser. The irradiation of the second laser and the third laser may be repeated multiple times.

Table 1 below illustrates the results of measuring the light transmittance of the polarizing plate before the first light-transmitting pattern 18d is formed and the light transmittance after the first light-transmitting pattern 18d is formed, in blue, green, and red wavelength ranges. J&C Tech's Hazemeter (JCH-3005) was used as measurement equipment.

With the results of the measurement, it can be seen that the light transmittance was improved by 8% in the blue wavelength range and the light transmittance is improved by 15% in the green wavelength range. In addition, the light transmittance was improved by 16% in the red wavelength region. Thus, it is confirmed that the light transmittance of the polarizing plate 18 was improved due to the first light-transmitting pattern 18d. On the other hand, it is confirmed that there was little change in the light transmittance in an IR range.

TABLE 1

| | Blue (470 nm) | Green (555 nm) | Red (650 nm) | IR (940 nm) |
|---|---|---|---|---|
| Light transmittance before formation of light-transmitting pattern | 42% | 43% | 43% | 90% |
| Light transmittance after formation of light-transmitting pattern | 50% | 58% | 59% | 91% |

In this case, when the wavelength range of the irradiated laser is adjusted, it is also possible to adjust the light transmittance in the blue, green, and red wavelength ranges to be uniform. When the light transmittance of the blue is relatively lower than those of the green and the red, laser light of a blue wavelength range may be further irradiated to the polarizer. As a result, the iodine compound absorbing the light in the corresponding wavelength range is partially decomposed to improve blue light transmittance. Thus, color uniformity may be improved. Referring to FIG. 12, a size of the first light-transmitting pattern 18d of the polarizing plate 18 may correspond to that of the light-transmitting area AG. As an example, the size (width, length, or diameter) of each of the first light-transmitting pattern 18d and the light-transmitting area AG may range from 5 µm to 200 µm. When the size of the first light-transmitting pattern is less than 5 µm, the effect of improving the light transmittance may be insignificant. When the size of the first light-transmitting pattern is greater than 200 there is a problem that the first light-transmitting pattern may be observed from the outside.

The shape of the first light-transmitting pattern 18d is not particularly limited. As an example, the first light-transmitting pattern 18d may have a rectangular shape or a circular shape. In addition, the first light-transmitting pattern 18d may have various shapes. That is, the shape of the first light-transmitting pattern 18d may be the same as the shape of the first light-transmitting area AG.

Referring to FIG. 13, the first light-transmitting pattern 18d of the polarizing plate 18 may include a plurality of openings. That is, the first light-transmitting pattern 18d may also be formed by partially removing the polarizer 18b. A method of partially removing the polarizer 18b is not particularly limited. As an example, the polarizer 18b may be partially removed using a semiconductor etching process, and also using a laser etching process.

For example, in the polarizer 18b, a polyvinyl alcohol (PVA)-based resin film may be stretched, and the resin film may be immersed in iodine and organic dyes to arrange iodine molecules and dye molecules in a stretching direction.

The first light-transmitting pattern 18d may be formed by forming a plurality of openings in the polarizer 18b in which the stretching process has been completed. In the process of forming the second protective layer 18c on the polarizer 18b, a portion of the second protective layer 18c may be inserted into a plurality of first light-transmitting patterns 18d to form protrusions 18c-1.

Figure 14:
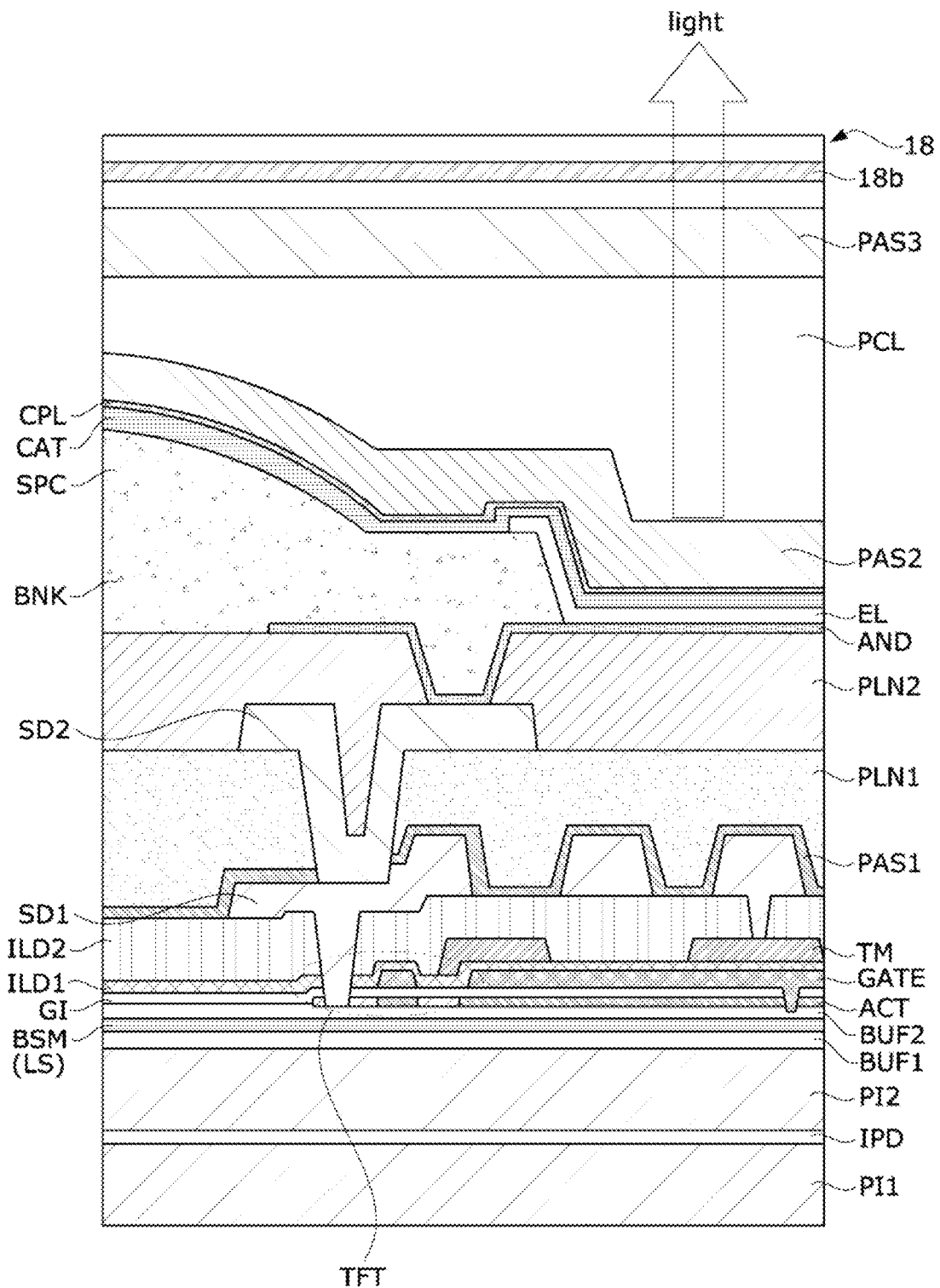
FIG. 14 is a cross-sectional view illustrating a cross-sectional structure of a pixel area in the display panel according to one aspect of the present disclosure.

FIG. 14 is a cross-sectional view illustrating a cross-sectional structure of a pixel area in a display panel according to one aspect of the present disclosure in detail, and FIG.

15 illustrates a cross-sectional structure of the pixel area and a light-transmitting area according to one aspect of the present disclosure.

The cross-sectional structure of the display panel 100 is not limited to that in FIG. 14. In FIG. 14, "TFT" represents a driving element DT of the pixel circuit.

Referring to FIG. 14, a circuit layer, a light-emitting element layer, and the like may be stacked on substrates PI1 and PI2 in a pixel area PIX. The substrates PI1 and PI2 may include a first PI substrate PI1 and a second PI substrate PI2. An inorganic film IPD may be formed between the first PI substrate PI1 and the second PI substrate PI2. The inorganic film IPD may block the penetration of moisture.

A first buffer layer BUF1 may be formed on the second PI substrate PI2. A first metal layer may be formed on the first buffer layer BUF1, and a second buffer layer BUF2 may be formed on the first metal layer.

The first metal layer may be patterned by a photolithography process. The first metal layer may include a light shield pattern BSM. The light shield pattern BSM may block external light so that the light does not irradiate to an active layer of a TFT, thereby preventing a photo current of the TFT formed in the pixel area from generating.

When the light shield pattern BSM is formed of a metal having a low absorption coefficient of a laser wavelength used in a laser ablation process as compared to a metal layer (e.g., a cathode) to be removed from the image area CA, the light shield pattern BSM may also serve as a light shield layer LS configured to block a laser beam LB in the laser ablation process.

Each of the first and second buffer layers BUF1 and BUF2 may be made of an inorganic insulating material and may be formed of one or more insulating layers.

An active layer ACT may be made of a semiconductor material deposited on the second buffer layer BUF2 and may be patterned by a photolithography process. The active layer ACT may include an active pattern of each of TFTs of the pixel circuit and TFTs of the gate driving unit. A portion of the active layer ACT may be metallized by ion doping. The metallized portion may be used as a jumper pattern connecting the metal layers at some nodes of the pixel circuit to connect components of the pixel circuit.

A gate insulating layer GI may be formed on the second buffer layer BUF2 so as to cover the active layer ACT. The gate insulating layer GI may be made of an inorganic insulating material.

A second metal layer may be formed on the gate insulating layer GI. The second metal layer may be patterned by a photolithography process. The second metal layer may include a gate line, a gate electrode pattern GATE, a lower electrode of a storage capacitor Cst1, a jumper pattern connecting patterns of the first metal layer and a third metal layer, and the like.

A first interlayer insulating layer ILD1 may be formed on the gate insulating layer GI so as to cover the second metal layer. The third metal layer may be formed on the first interlayer insulating layer ILD1, and a second interlayer insulating layer ILD2 may cover the third metal layer. The third metal layer may be patterned by a photolithography process. The third metal layer may include metal patterns TM, such as an upper electrode of the storage capacitor Cst1. The first and second interlayer insulating layers ILD1 and ILD2 may each include an inorganic insulating material.

A fourth metal layer may be formed on the second interlayer insulating layer ILD2, and an inorganic insulating layer PAS1 and a first planarization layer PLN1 may be stacked on the fourth metal layer. A fifth metal layer may be formed on the first planarization layer PLN1.

Some patterns of the fourth metal layer may be connected to the third metal layer through a contact hole passing through the first planarization layer PLN1 and the inorganic insulating layer PAS1. The first and second planarization layers PLN1 and PLN2 may each be made of an organic insulating material enabling surfaces thereof to be flat.

The fourth metal layer may include first and second electrodes of a TFT connected to an active pattern of the TFT through a contact hole passing through the second interlayer insulating layer ILD2. A data line DL and power lines PL1, PL2, and PL3 may be implemented using a pattern SD1 of the fourth metal layer or a pattern SD2 of the fifth metal layer.

An anode AND, which is a first electrode layer of the light-emitting element OLED, may be formed on the second planarization layer PLN2. The anode AND may be connected to an electrode of a TFT used as a switch element or a driving element through a contact hole passing through the second planarization layer PLN2. The anode AND may be made of a transparent or semitransparent electrode material.

A pixel defining film BNK may cover the anode AND of the light-emitting element OLED. The pixel defining film BNK may be formed as a pattern that defines an emission area (or an opening area) through which light passes to the outside from each of the pixels. A spacer SPC may be formed on the pixel defining film BNK. The pixel defining film BNK and the spacer SPC may be integrated with the same organic insulating material. The spacer SPC may secure a gap between a fine metal mask (FMM) and the anode AND so that the FMM is not in contact with the anode AND in a deposition process of an organic compound EL.

The organic compound EL may be formed in the emission area of each of the pixels, which is defined by the pixel defining film BNK. A cathode CAT, which is a second electrode layer of the light-emitting element OLED, may be formed on the entire surface of the display panel 100 so as to cover the pixel defining film BNK, the spacer SPC, and the organic compound EL. The cathode CAT may be connected to a VSS line PL3 formed of any one of the metal layers therebelow. A capping layer CPL may cover the cathode CAT. The capping layer CPL may be made of an inorganic insulating material to block the penetration of the air and out-gassing of the organic insulating material, which is applied on the capping layer CPL, to protect the cathode CAT. An inorganic insulating layer PAS2 may cover the capping layer CPL, and the planarization layer PCL may be formed on the inorganic insulating layer PAS2. The planarization layer PCL may include an organic insulating material. An inorganic insulating layer PAS3 of the encapsulation layer may be formed on the planarization layer PCL.

A polarizing plate 18 may be disposed on the inorganic insulating layer PAS3 to improve outdoor visibility of the display device. The polarizing plate 18 may reduce light reflected from a surface of the display panel 100 and block the light reflected from metal of the circuit layer 12, thereby improving the brightness of the pixels.

Figure 15:
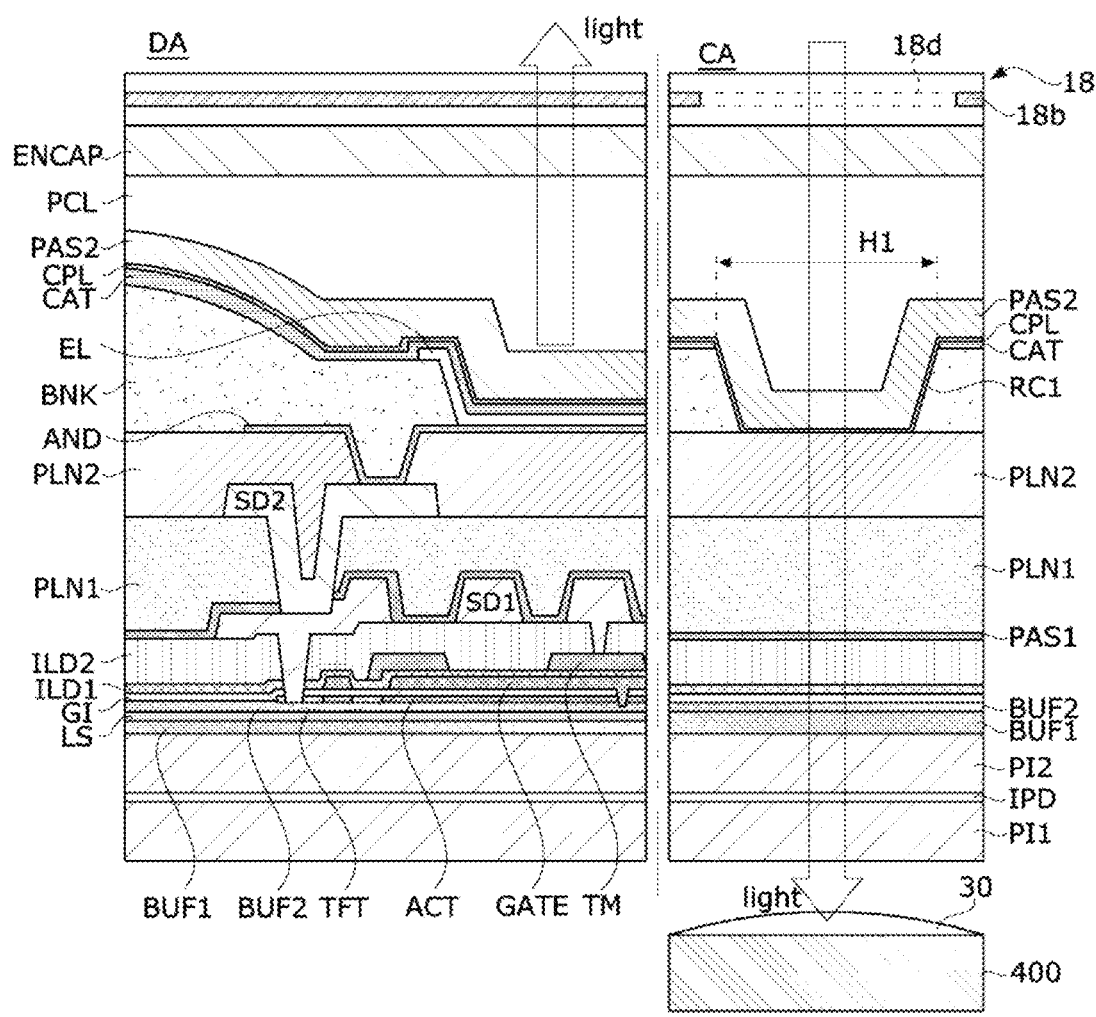
FIG. 15 illustrates a cross-sectional structure of the pixel area and a light-transmitting area according to one aspect of the present disclosure.

Referring to FIG. 15, in the light-transmitting area AG, the first light-transmitting pattern 18d may be formed in the polarizing plate 18. The first light-transmitting pattern 18d may be formed by discoloring the polarizer 18b using a laser, or the first light-transmitting pattern 18d may be formed by partially removing the polarizer 18b.

In the light-transmitting area AG, an opening H1 may be formed in the cathode CAT. The opening H1 may be formed by forming the cathode CAT on the pixel defining film BNK and then etching the cathode CAT and the pixel defining film BNK at once. Accordingly, a first groove RC1 may be formed in the pixel defining film BNK, and the opening H1 of the cathode CAT may be formed on the first groove RC1. However, the present disclosure is not necessarily limited thereto, and the cathode CAT may be disposed on the second planarization layer PLN2 without forming the pixel defining film on the light-transmitting area AG.

According to the aspect, in the light-transmitting area AG, the first light-transmitting pattern 18d is formed in the polarizing plate 18, and the opening H1 is formed in the cathode, so that light transmittance may be improved. Thus, a sufficient amount of light may be introduced into the camera module 400 so that camera performance may be improved. In addition, noise of imaged image data may be reduced.

Figure 16:
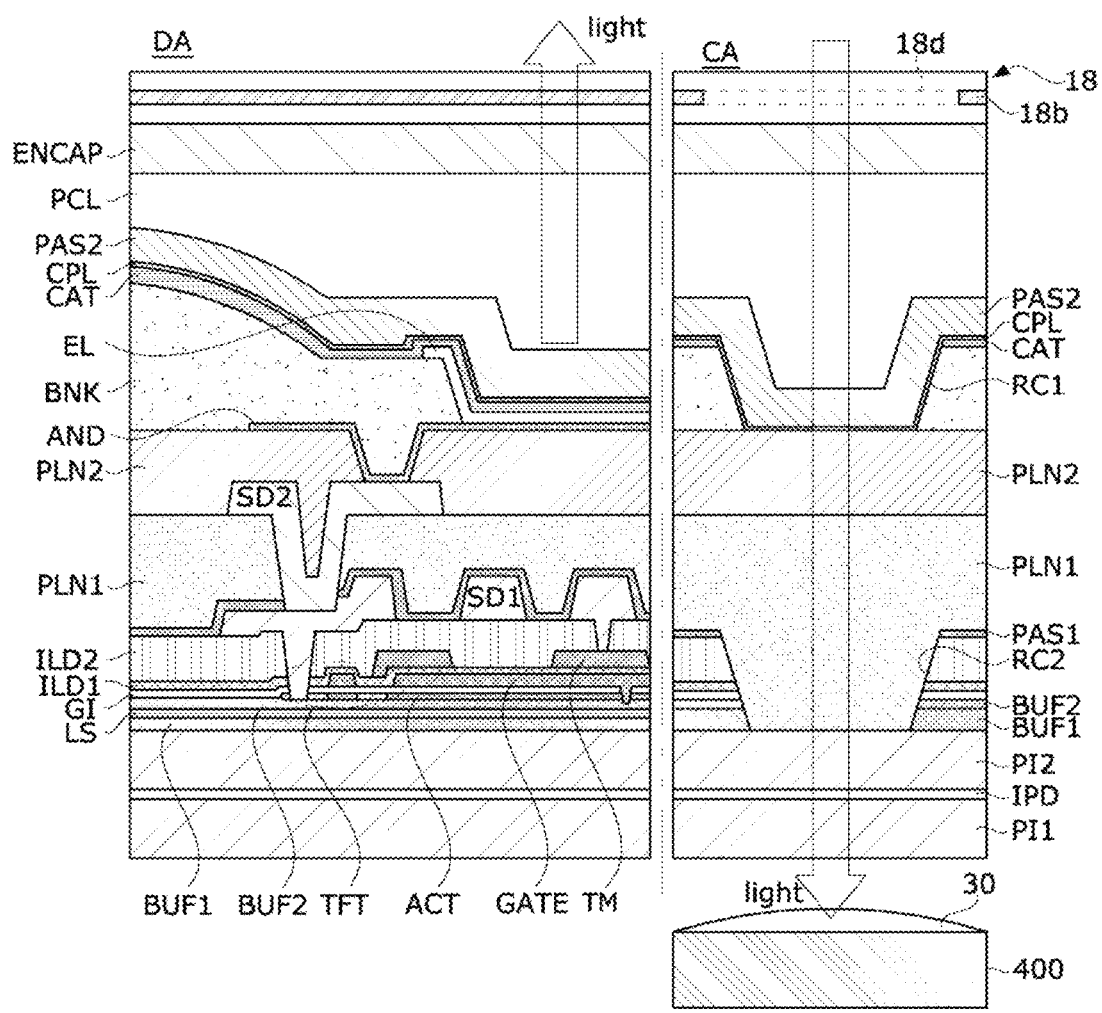
FIG. 16 is a first modified example of FIG. 15.
Figure 17:
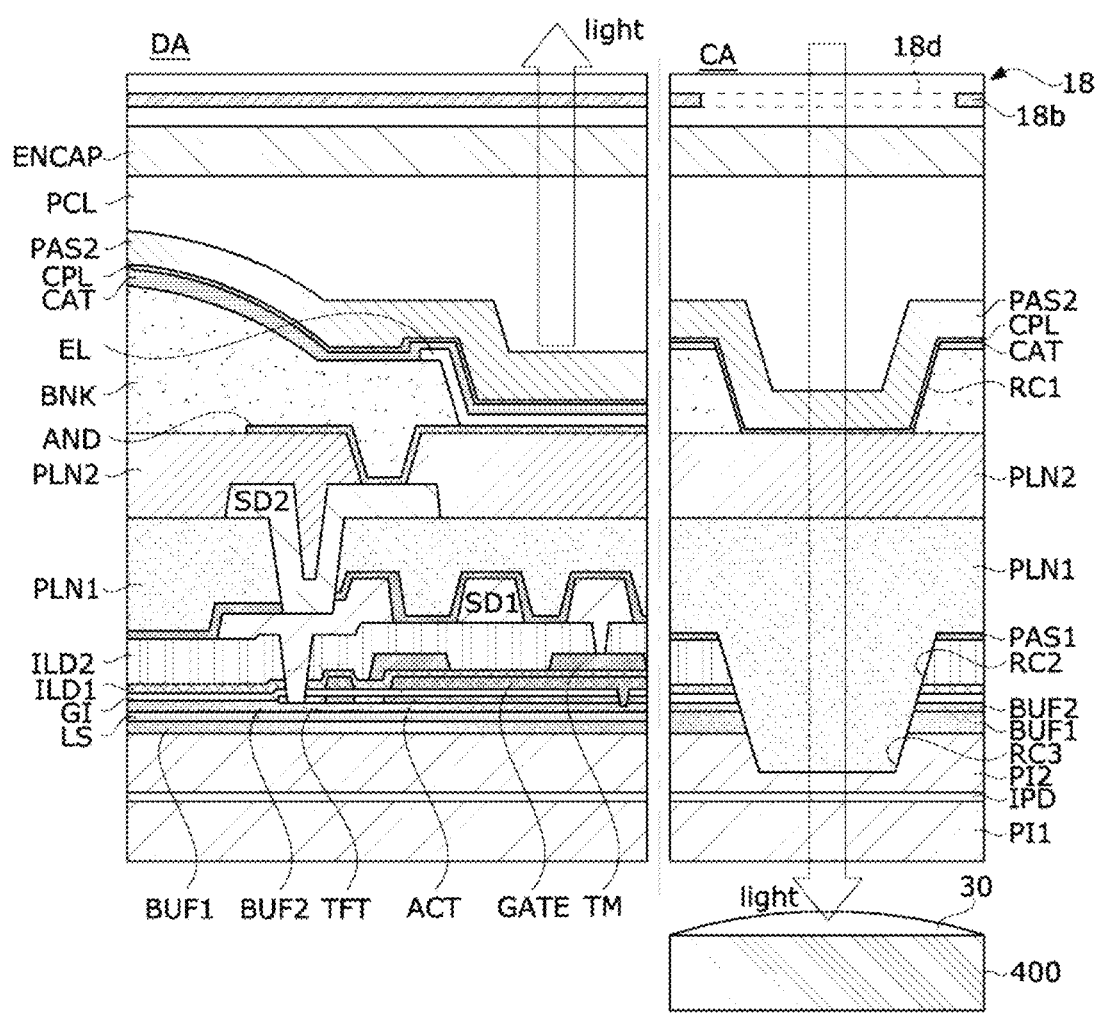
FIG. 17 is a second modified example of FIG. 15.

FIG. 16 is a first modified example of FIG. 15, and FIG. 17 is a second modified example of FIG. 15.

Referring to FIG. 16, a second groove RC2 passing through a buffer layer of the circuit layer and at least one of the plurality of insulating layers may be formed in the light-transmitting area AG. In addition, the first planarization layer PLN1 may include a protrusion inserted into the second groove RC2. With this configuration, interfaces of the plurality of layers may be omitted, so that light transmittance of the light-transmitting area AG may be improved.

Referring to FIG. 17, a third groove RC3 may be formed in a first surface (upper surface) of the substrates PI1 and PI2, on which the plurality of insulating layers are formed, and the third groove RC3 may be connected to the second groove RC2. That is, in a process of forming the second groove RC2 after the inorganic insulating films ILD2 and PAS1 are formed, a groove may be formed up to the second PI substrate PI2. In addition, the groove may also be formed up to a partial area of the second PI substrate PI2 through the inorganic film IPD as needed.

FIGS. 18 to 21 illustrate cross-sectional structures of a display area and an image area according to still another aspect of the present disclosure.

Even in the structure for improving the light transmittance in the image area CA described in FIGS. 15 to 17, there are cases in which it is difficult to secure the image quality of the camera because the substrates PI1 and PI2 themselves have low light transmittance. Particularly, when colored polyimide (PI) is used for the substrate, since transmittance of blue light is low, such a problem occurs frequently. On the other hand, when transparent polyimide is used for the substrate, the transmittance is improved, but there is a problem of durability, and thus, it is difficult to apply the transparent polyimide to a mass production process. Thus, the present inventors designed a substrate structure having no problem with light transmittance while using colored polyimide (for example, yellow PI) which is more suitable for the process. The above-described structure may be implemented by providing a high-transmission area having a higher light transmittance than the remaining portion in a position corresponding to the second area CA. In the case in which a double-layered polyimide substrate is used as in FIGS. 15 to 17, the high-transmission area may be provided in the first PI substrate PI1 and/or the second PI substrate PI2. In this case, the high-transmission area may be provided to correspond to the entire or a portion of the image area CA. The high-transmission area may be formed through a process of removing a partial area of the substrate of the image area CA and filling the removed space with a material having a high transmittance. The filling material may be selected from among materials that have high transmittance of blue light and maintain color balance with other areas.

A display panel shown in FIGS. 18 to 21 may include a substrate having a first area DA in which first pixels are disposed and a second area CA in which second pixels and a light-transmitting area AG that is disposed between the second pixels are disposed, and a polarizing plate 18 having a light-transmitting pattern 18d that is disposed above the light-transmitting area AG and has a light transmittance higher than that of the remaining area. The second area CA may overlap a camera module 400, and a resolution of the second pixels disposed in the second area CA may be lower than a resolution of the first pixels disposed in the first area DA.

The substrate may include a first substrate PI1, a second substrate PI2, and an inorganic film IPD disposed between the first substrate PI1 and the second substrate PI2. At this point, the first pixels and the second pixels are disposed on the second substrate PI2. The high-transmission area may include at least one of a first high-transmission area provided in the first substrate PI1 and a second high-transmission area provided in the second substrate PI2.

The high-transmission area provided in the substrate may be located to correspond to the light-transmitting pattern 18d of the polarizing plate 18. In this case, the high-transmission area may be formed in substantially the same shape and same area as the light-transmitting pattern 18d but is not limited thereto and may be implemented in different shapes and different areas as needed. The polarizing plate 18 may include a first protective layer, a second protective layer, and a polarizer 18b disposed between the first protective layer and the second protective layer, and the light-transmitting pattern 18d may be formed in the polarizer 18b. The light-transmitting pattern 18d may include an opening formed in the polarizer 18b, and here, the first protective layer may include a protrusion inserted into the opening. The light-transmitting area may include a discolored area formed in the polarizer 18b, and the discolored area may be an area in which an iodine compound of the polarizer 18b is decomposed.

Figure 18:
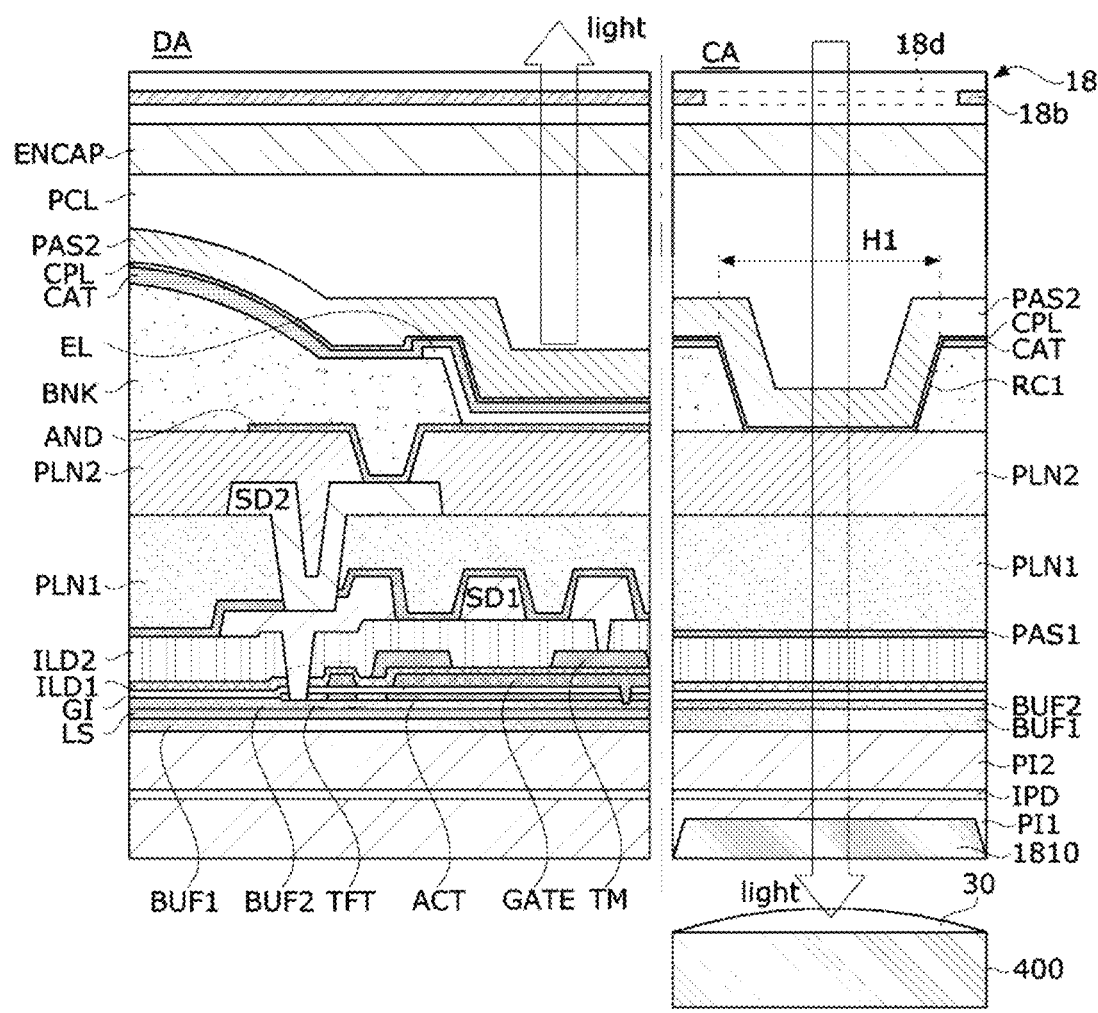
FIGS. 18, 19A, 19B, 20 and 21 illustrate cross-sectional structures of a display area and an image area according to still another aspect of the present disclosure.

FIG. 18 illustrates a first high-transmission area 1810 provided in the first substrate PI1. In the aspect of FIG. 18, the first high-transmission area 1810 may be an area in which the first substrate PI1 is removed and filled with a transparent resin. The first high-transmission area 1810 may be formed through a process of detaching the substrates PI1 and PI2 from a mother substrate, a process of trimming a specific area of the first substrate PI1, and a process of filling the space, from which the first substrate is removed by the trimming process, with a transparent resin.

Figure 19A:
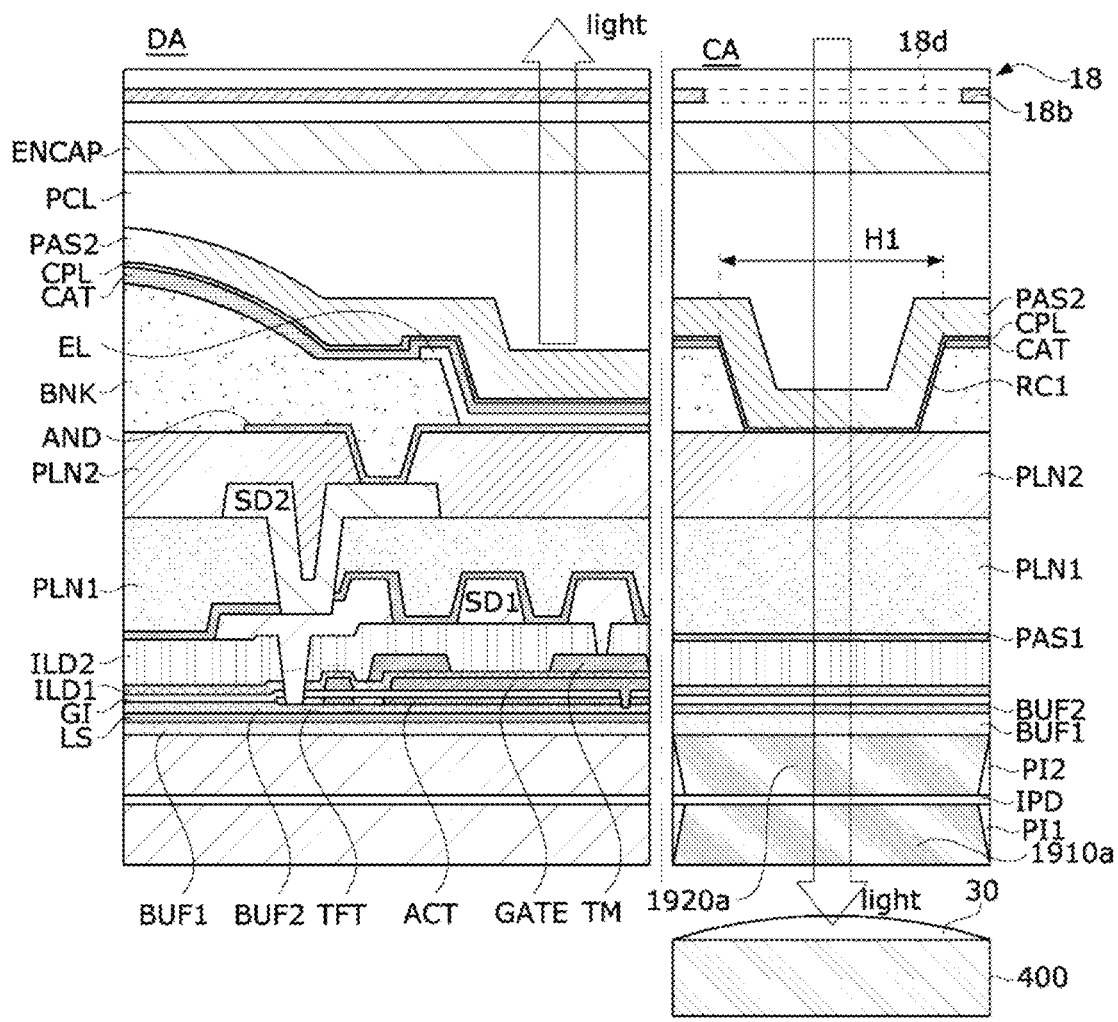
Figure 19B:
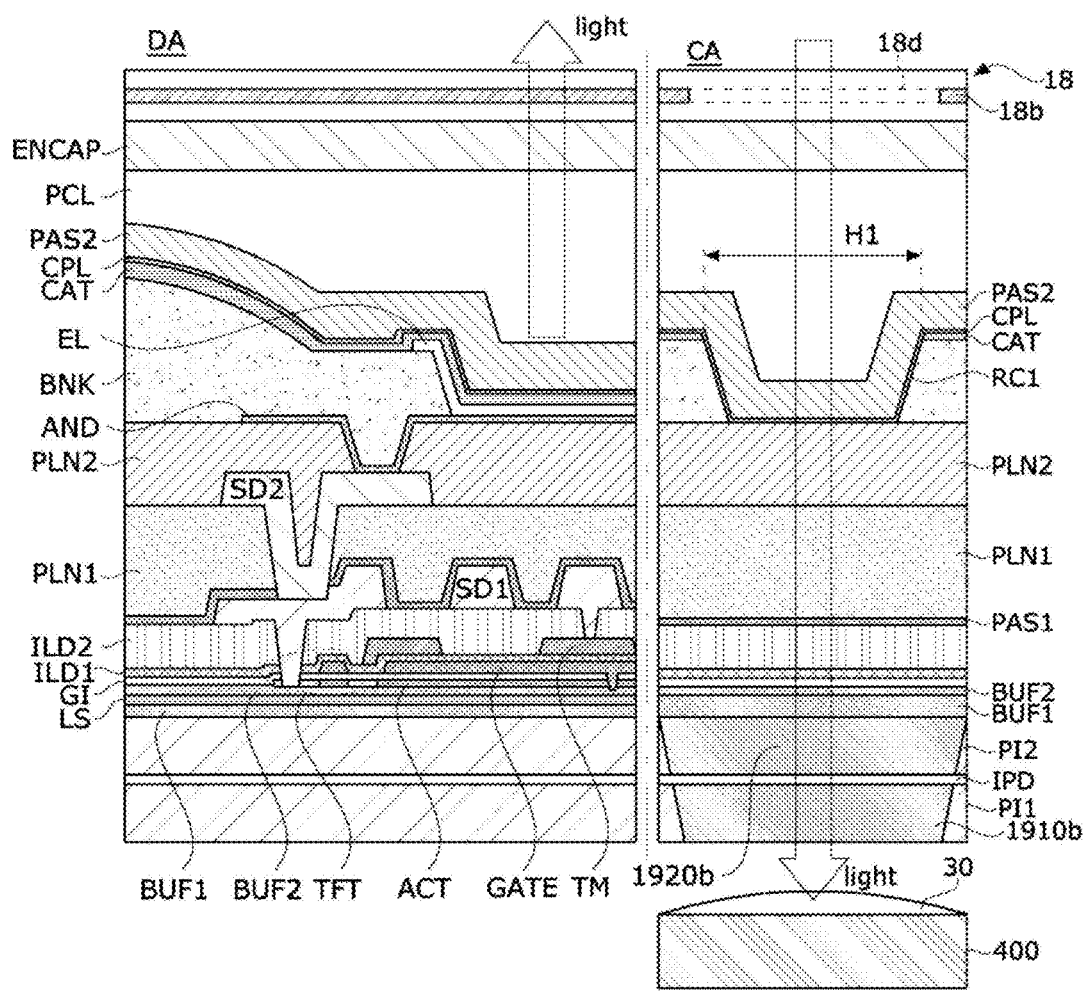

FIGS. 19A and 19B illustrate first high-transmission areas 1910a and 1910b provided in the first substrate PI1, and second high-transmission areas 1920a and 1920b provided in the second substrate PI2. The first high-transmission areas 1910a and 1910b may be provided in the same manner as the first high-transmission area 1810 of FIG. 18. The second high-transmission areas 1920a and 1920b may be areas in which the second substrate PI2 is removed and filled with a transparent organic material or a transparent inorganic material.

The second high-transmission areas 1920a and 1920b may be formed by a process of etching a specific area of the second substrate PI2, and a process of filling the trimmed space with an organic film and/or an inorganic film. The organic or inorganic material may be the same material as the materials of the first buffer layer BUF1, the second buffer layer BUF2, the gate insulating layer GI, the first interlayer insulating layer ILD1, the second interlayer insulating layer ILD2, the first planarization layer PLN1, the second planarization layer PLN2, and the like as the layers constituting the first pixel or the second pixel, or may be a separate material.

The first high-transmission areas 1910a and 1910b and the second high-transmission areas 1920a and 1920b may each have a tapered cross-section. In this case, as shown in FIG. 19A, the cross-sections of the first and second high-transmission areas 1910a and 1920a may have shapes facing in opposite directions from each other. That is, the first high-transmission area 1910a may have a forward-tapered shape and the second high-transmission area 1920a may have a reverse-tapered shape, or vice versa. Alternatively, as shown in FIG. 19B, the first and second high-transmission areas 1910b and 1920b may have the same cross-sectional shape. That is, both may have a reverse-tapered shape or a forward-tapered shape. In particular, here, in a cross-sectional view as shown in FIG. 19B, a lateral side of the first high-transmission area 1910b may be collinear with a lateral side of the second high-transmission area 1920b. Such a shape may be formed by etching all of the first high-transmission area 1910b and the second high-transmission area 1920b at once and then sequentially filling the etched space with a first high-transmission area filling material, the inorganic film IPD, and a second high-transmission area filling material.

Figure 20:
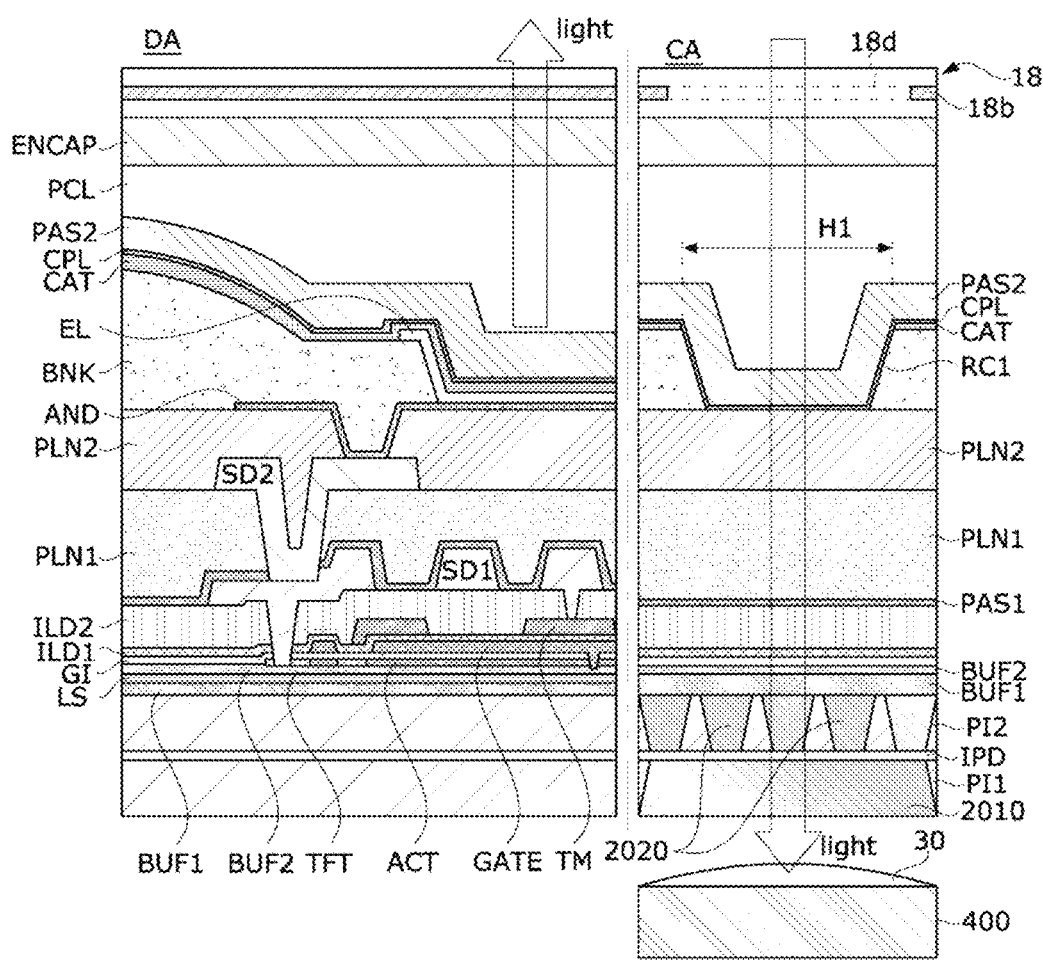

FIG. 20 illustrates a first high-transmission area 2010 provided in the first substrate PI1 and a second high-transmission area 2020 provided in the second substrate PI2. The second high-transmission area 2020 may be provided at a position corresponding to the light-transmitting area AG in the second area CA. That is, a plurality of second high-transmission areas 2020 may be provided in the second area CA.

Figure 21:
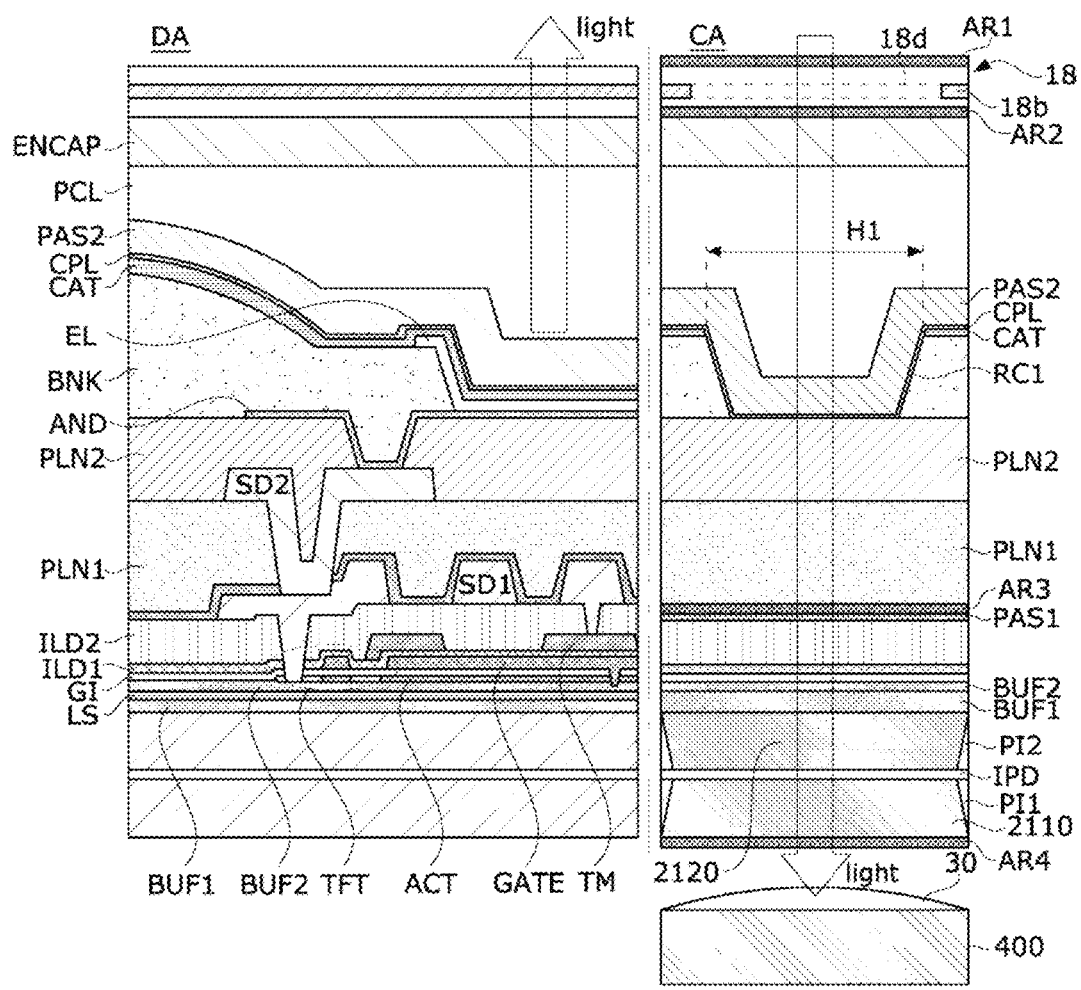

FIG. 21 illustrates an aspect further including anti-reflection layers AR1, AR2, AR3, and AR4 that are disposed in the second area CA. The anti-reflection layers AR1, AR2, AR3, and AR4 are provided to allow external light to easily enter the inside of the panel and to reduce a ghost image generated due to the reflection of light from the panel. The anti-reflection layers AR1, AR2, AR3, and AR4 may reduce an interface reflection of the panel. Further, the anti-reflection layers AR1, AR2, AR3, and AR4 may selectively transmit/reflect light in a visible range to reduce haze and/or diffused light.

The anti-reflection layers AR1, AR2, AR3, and AR4 may selectively transmit light incident at a specific angle toward the camera module 400. The haze may be calculated by D.T/T.T (where, D.T: diffuse transmittance, and T.T: total transmittance), which means that there is a large amount of haze when diffused (or scattered) light is incident on the camera. Thus, as one aspect for reducing a D.T component, the anti-reflection layers AR1, AR2, AR3, and AR4 may be designed to transmit light incident at an angle difference of 10° or less and reflect light incident at an angle difference of 10° or more with respect to straight light in a wavelength range of 380 to 780 nm.

The anti-reflection layer may be disposed on at least one of an upper portion AR1 of the polarizing plate 18, a lower portion AR2 of the polarizing plate 18, an upper portion AR3 of the interlayer insulating layers ILD1 and ILD2, and a lower portion AR4 of the substrate. The anti-reflection layers AR1, AR2, AR3, and AR4 may be selectively patterned only in a position overlapping the first high-transmission area 2110 and/or the second high-transmission area 2120. The anti-reflection layers AR1, AR2, AR3, and AR4 may be made of any one or more of $MgF_2$, $CeF_2$, $ZrO_2$, $SiO_2$, $TiO_2$, and $Al_2O_3$.

The aspects of the present disclosure can provide a display device in which an optical device is mounted without causing any loss to a display area. More specifically, the aspects of the present disclosure can increase light transmittance in an image area. Accordingly, in the aspects of the present disclosure, noise of captured image data can be reduced so that camera performance can be improved. Accordingly, in the display device according to the aspects of the present disclosure, esthetics and functionality can be improved. The effects according to the aspects of the present disclosure are not limited by the contents exemplified above, and more various effects are included in the present specification.

While the aspects of the present disclosure have been described in detail above with reference to the accompanying drawings, the present disclosure is not necessarily limited to these aspects, and various changes and modifications may be made without departing from the technical spirit of the present disclosure. Accordingly, the aspects disclosed herein are to be considered descriptive and not restrictive of the technical spirit of the present disclosure, and the scope of the technical spirit of the present disclosure is not limited by these aspects. The features of various aspects of the present disclosure can be partially or entirely bonded to or combined with each other and can be interlocked and operated in various ways technically by those skilled in the art, and the exemplary aspects can be carried out independently of or in association with each other.

The scope of the present disclosure should be construed by the appended claims along with the full range of equivalents to which such claims are entitled.

What is claimed is:

1. A display panel comprising:
a substrate having a first area in which first pixels are disposed and a second area in which second pixels and a light-transmitting area are disposed between the second pixels; and
a polarizing plate disposed over the substrate and including a light-transmitting pattern disposed above the light-transmitting area and having a light transmittance higher than a light transmittance of a remaining area in the polarizing plate,
wherein the substrate includes a high-transmission portion overlapped with the second area, and
wherein a light transmittance of light passing through the high-transmission portion is higher than a light transmittance of light passing through an area of lower light transmittance corresponding to the second area.

2. The display panel of claim 1, wherein the second area overlaps with a camera module, and a resolution of the second pixels disposed in the second area is lower than a resolution of the first pixels disposed in the first area.

3. The display panel of claim 1, wherein the high-transmission portion is located to correspond to the light-transmitting pattern.

4. The display panel of claim 1, wherein the substrate includes a first substrate, a second substrate, and an inorganic film formed between the first substrate and the second substrate,
wherein the first pixels and the second pixels are disposed on the second substrate, and
wherein the high-transmission portion includes at least one of a first high-transmission portion provided in the first substrate and a second high-transmission portion provided in the second substrate.

5. The display panel of claim 4, wherein the first high-transmission portion is an area in which the first substrate is removed and filled with a transparent resin.

6. The display panel of claim 4, wherein the second high-transmission portion is an area in which the second substrate is removed and filled with a transparent organic material or a transparent inorganic material.

7. The display panel of claim 6, wherein the transparent organic or inorganic material is the same material as a layer included in the first pixel or the second pixel.

8. The display panel of claim 4, wherein the second high-transmission portion is provided at a position corresponding to the light-transmitting area in the second area.

9. The display panel of claim 4, wherein each of the first high-transmission portion and the second high-transmission portion has a tapered cross-section, and in a cross-sectional view, a lateral side of the first high-transmission portion is collinear with a lateral side of the second high-transmission portion.

10. The display panel of claim 4, wherein the first high-transmission portion has a forward-tapered cross-section and the second high-transmission portion has a reverse-tapered cross-section.

11. The display panel of claim 4, wherein the first high-transmission portion has a reverse-tapered cross-section and the second high-transmission portion has a forward-tapered cross-section.

12. The display panel of claim 1, wherein the polarizing plate includes a first protective layer, a second protective layer, and a polarizer disposed between the first protective layer and the second protective layer, and
wherein the light-transmitting pattern is formed in the polarizer.

13. The display panel of claim 12, wherein the light-transmitting pattern includes an opening formed in the polarizer.

14. The display panel of claim 13, wherein the first protective layer includes a protrusion inserted into the opening.

15. The display panel of claim 12, wherein the light-transmitting area includes a discolored area formed in the polarizer.

16. The display panel of claim 15, wherein the discolored area is an area in which an iodine compound of the polarizer is decomposed.

17. The display panel of claim 1, further comprising an anti-reflection layer disposed in the second area and provided to reduce diffusion or reflection of incident light.

18. The display panel of claim 17, wherein the anti-reflection layer is located on at least one of an upper portion of an interlayer insulating layer, a lower portion of the substrate, an upper portion of the polarizing plate, and a lower portion of the polarizing plate.

19. A display device comprising a display panel:
wherein the display panel comprises:
a substrate having a first area in which first pixels are disposed and a second area in which second pixels and a light-transmitting area are disposed between the second pixels; and
a polarizing plate disposed on the substrate and including a light-transmitting pattern disposed above the light-transmitting area and having a light transmittance higher than a light transmittance of a remaining area in the polarizing plate,
wherein the substrate includes a high-transmission portion overlapped with the second area, and
wherein a light transmittance of light passing through the high-transmission portion is higher than a light transmittance of light passing through an area of lower light transmittance corresponding to the second area.

20. The display device of claim 19, wherein the second area overlaps with a camera module, and a resolution of the second pixels disposed in the second area is lower than a resolution of the first pixels disposed in the first area.

21. A display panel comprising:
a substrate having a first area in which first pixels are disposed and a second area in which second pixels and a light-transmitting area are disposed between the second pixels; and
a polarizing plate disposed on the substrate and including a light-transmitting pattern disposed above the light-transmitting area and having a light transmittance higher than a light transmittance of a remaining area in the polarizing plate,
wherein the polarizing plate includes a first protective layer, a second protective layer, and a polarizer disposed between the first protective layer and the second protective layer, and
wherein the light-transmitting pattern is formed in the polarizer.

* * * * *